(12) United States Patent
Yen et al.

(10) Patent No.: US 7,489,740 B2
(45) Date of Patent: Feb. 10, 2009

(54) RECEIVER WITH BASELINE WANDER COMPENSATION

(75) Inventors: Ming-Chou Yen, Hsin Chu (TW); Kun-Ying Tsai, Hsin Chu (TW); Jui-Tai Ko, Hsin Chu (TW); Chun-Wang Wei, Hsin Chu (TW)

(73) Assignee: RDC Semiconductor Co., Ltd. (TW)

( * ) Notice: Subject to any disclaimer, the term of this patent is extended or adjusted under 35 U.S.C. 154(b) by 632 days.

(21) Appl. No.: 11/205,627

(22) Filed: Aug. 16, 2005

(65) Prior Publication Data

US 2006/0120491 A1    Jun. 8, 2006

(30) Foreign Application Priority Data

Dec. 2, 2004    (TW) .............................. 93137147 A

(51) Int. Cl.
*H04L 25/06* (2006.01)
*H04L 25/10* (2006.01)

(52) U.S. Cl. ...................................... 375/317; 375/345

(58) Field of Classification Search ......... 375/317–319, 375/345
See application file for complete search history.

(56) References Cited

U.S. PATENT DOCUMENTS 6,266,366 B1 *   7/2001   Greiss et al. ................ 375/229
6,404,829 B1 *   6/2002   Sonu .......................... 375/345
6,415,003 B1     7/2002   Raghavan
7,254,194 B2 *   8/2007   Lin et al. .................... 375/345
7,333,603 B1 *   2/2008   Sallaway et al. ............ 379/391
2003/0206604 A1* 11/2003   Lai ............................. 375/350

* cited by examiner

*Primary Examiner*—Chieh M. Fan
*Assistant Examiner*—Freshteh N Aghdam
(74) *Attorney, Agent, or Firm*—Peter F. Corless; Steven M. Jensen; Edwards Angell Palmer & Dodge LLP

(57) ABSTRACT

A receiver with baseline wander compensation is applicable to a digital communication system. The receiver includes an Analog-to-Digital Converter (ADC), a slicer, a threshold value detector, a gain controller, a baseline wander compensator, a delay circuit, an analog gain stage, and a digital gain stage. The baseline wander compensator is used to perform an operation and a filtering process on a voltage obtained prior to processing by the slicer and a voltage after the processing so as to obtain a baseline wander voltage value for compensation and control. The threshold value detector and the gain controller dynamically produce control signals of analog gain and digital gain. The analog gain stage compensates degrading of communication signals passing through transmission channels in an analog gain manner. The delay circuit is used to compensate the delay of the conversion performed by the ADC. The digital gain stage compensates insufficiency of the analog gain.

21 Claims, 4 Drawing Sheets

RECEIVER WITH BASELINE WANDER COMPENSATION

BACKGROUND OF THE INVENTION

1. Field of the Invention

The invention relates to compensating devices, and more particularly, to a receiver with baseline wander compensation applicable to a network system, such as Ethernet to prevent baseline wander interference.

2. Description of the Related Art

When data is transmitted between main systems of two ends via Ethernet, a transmission system is served as a transmission medium. As illustrated in FIG. 1, the transmission system includes a transmitter 10, a sending coupler 12, a transmission channel 14, a receiving coupler 13 and a receiver 11, such that a receiver main system 21 receives signal from a transmitter main system 20 via the transmission system.

The transmission channel 14 of the transmission system includes a transmission interface such as a twisted-pair wire, an optical fiber or a coaxial cable. Since the sending coupler 12 and the receiving coupler 13 are electrically insulated devices, damages to transmission system caused by receiving specific signals are prevented. However, due to the electrical properties of the sending coupler 12 and the receiving coupler 13, a magnetic coupling effect is produced to prevent a passage of direct current (DC) therethrough. As a result, the input signal sent to the receiver 11 has a exponential index degraded. That is, a baseline wander effect is produced to increase the bit error at the receiver end of the transmission system. Thus, it is a major issue of a network transmission industry to eliminate occurrence of the baseline wander in the transmission system.

In the U.S. Pat. No. 6,415,003, a conventional baseline wander correction circuit is proposed as illustrated in FIG. 2. The conventional baseline wander correction circuit is formed in the receiver 11', wherein the baseline wander correction circuit adds an ADC reference voltage generator 112 between an ADC 110 and a slicer 111 of the receiver 11', such that the ADC 110 receives a reference voltage Vref from the ADC reference voltage generator 112. At an initial stage of the transmission, the reference voltage Vref is determined based on the cable length to prevent clipping of the communication signal input to the ADC, and with cooperation of a digital baseline wander correction circuit, the baseline wander effect is eliminated.

However, such baseline wander correction circuit still contains several drawbacks. The ADC reference voltage generator 112 needs to generate different reference voltages Vref according to the length of the transmission channel 14' (such as twisted-pair wire) or parameters related to the length of the transmission channel 14'. In order to match the reference voltage Vref provided by the ADC reference voltage generator 112 with the common length (e.g. 1-120 m) of the transmission channel 14', the reference voltage Vref is normally set to be 2 volts over a short cable length, whereas the reference voltage Vref is set to be 1.33 volts over a long cable length. Although larger reference voltage Vref can effectively prevent receiving data error of the receiver 11' caused by baseline wander interference, the resolution of the ADC 110 is on the other hand degraded.

Therefore, it is a current issue for the transmission system to prevent baseline wander interference without affecting the resolution of the ADC at the same time.

SUMMARY OF THE INVENTION

In light of the above and other drawbacks, an objective of the present invention is to provide a receiver with baseline wander compensation applicable to a network transmission system, so as to prevent occurrence of data error due to baseline wander interference to the receiver of the network transmission system, and to effectively enhance resolution without increasing bit number of the ADC.

Another objective of the present invention is to provide a receiver with baseline wander compensation applicable to the network transmission system, whereby the gain control signal and appropriate compensation voltage are automatically generated based on the baseline wander compensation voltage instead of transmission channel length and relative parameters thereof, so as to achieve baseline wander compensation process.

In accordance with the above and other objectives, the present invention proposes a receiver with baseline wander compensation. The receiver with baseline wander compensation is applicable to the receiver in the network transmission system. The receiver has at least an analog-to-digital converter (ADC) for receiving and performing an analog-to-digital conversion to a communication signal from the network system; a slicer for receiving and performing mapping process to the digital processed signal; a baseline wander compensator for receiving, computing and filtering the slicer input and slicer output voltages; a threshold value detector for receiving the baseline wander voltage value from the baseline wander compensator, wherein the threshold value detector has hysteresis and delayed functionality, where a binary word control signals are outputted after the voltage value is determined to be either higher than the upper threshold value or lower than the lower threshold value for a period of time; a gain controller for receiving the binary word control signals from the threshold value detector and further providing analog and digital voltage gain control signals; an analog gain stage for receiving gain control signal output from the gain controller and inputting the communication signal compensated by the analog gain stage to the ADC which performs analog-to-digital conversion to the communication signal; a delay circuit for compensating the signal delay of the communication signal caused by analog-to-digital signal conversion via the ADC; a digital gain stage for receiving the delayed digital gain control signal, so as to provide signal amplitude adjustment and compensation to the digital signal outputted from the ADC; and an adder for computing the baseline wander voltage outputted from the baseline wander compensator and the communication signal which is completed with signal amplitude adjustment and compensation and outputted from the ADC.

Therefore, the receiver with baseline wander compensation is subjected to dynamic adjustment via the analog and digital gain stage originally available in the system. With cooperation of the digital baseline wander compensator, the receiver of the network transmission system prevents occurrence of data error due to baseline wander interference. And the resolution is effectively enhanced without increasing bit number of the ADC, thereby reducing bit error of the system.

In order to provide a further understanding of the invention, the following detailed description illustrates embodiments and examples of the invention, it is to be understood that this detailed description is being provided only for illustration of the invention and not as limiting the scope of this invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

The present invention is described below with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention.

Figure 1:
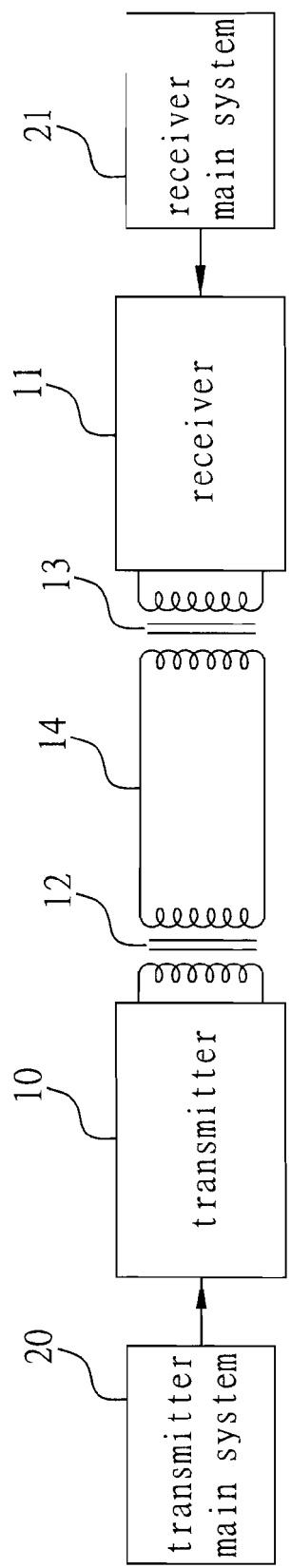
FIG. 1 is a schematic diagram illustrating a basic layout required in the conventional network transmission.
Figure 2:
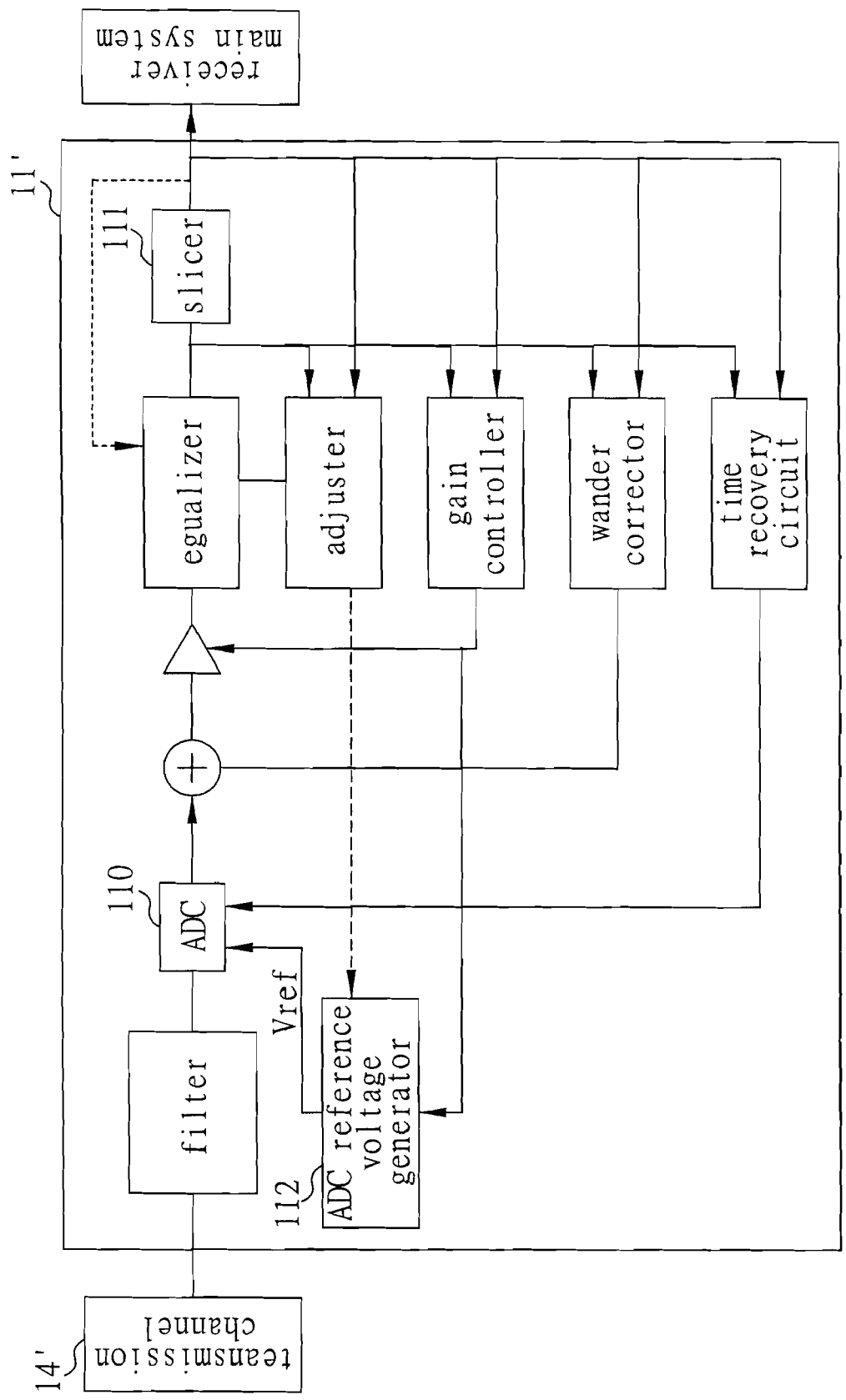
FIG. 2 is a block diagram illustrating a basic layout of a conventional receiver with baseline wander correction circuit.
Figure 3:
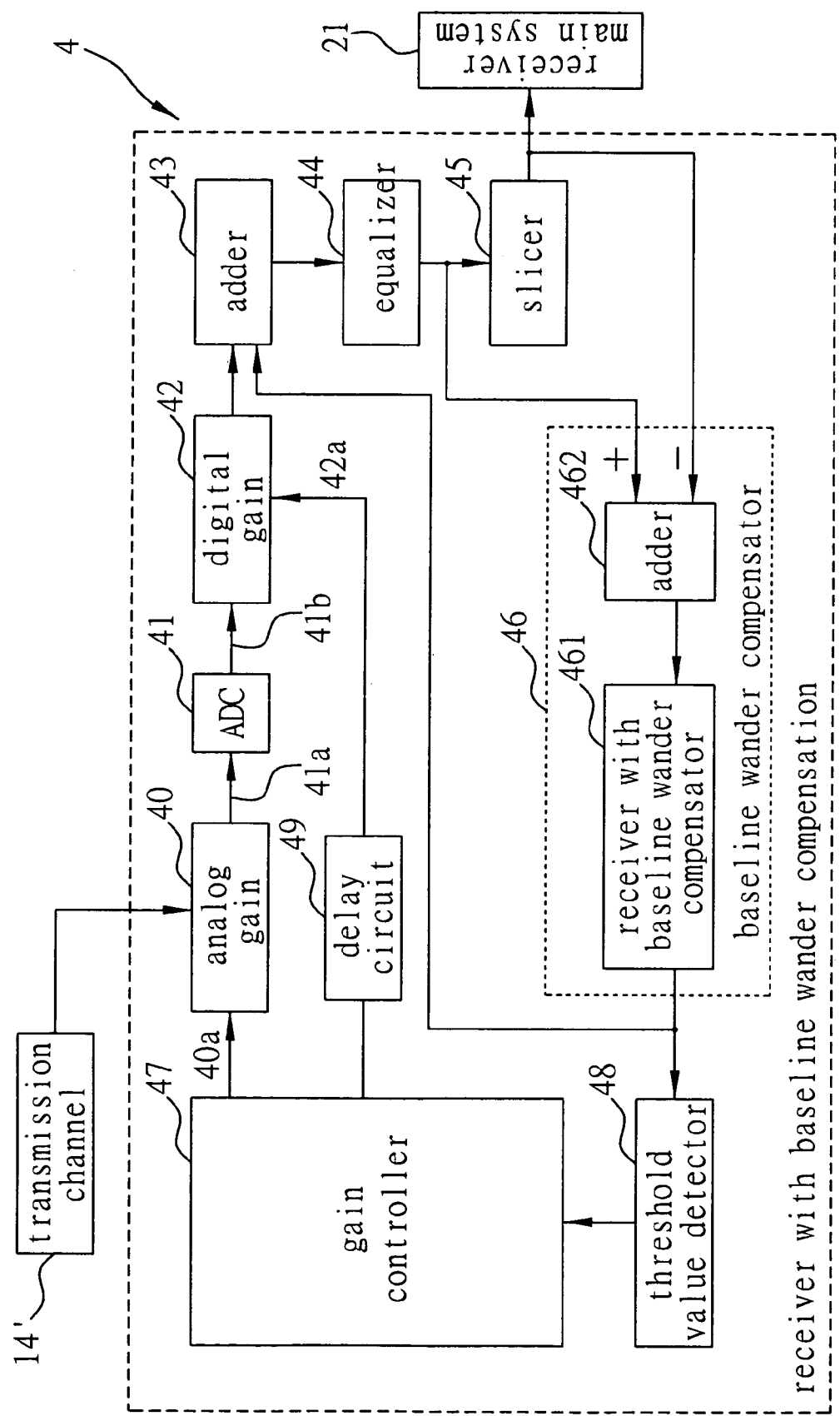
FIG. 3 is a schematic diagram illustrating a basic layout of the receiver with baseline wander compensation according to the present invention.

FIG. 3 is a schematic diagram illustrating a basic architecture of a receiver with baseline wander compensation according to the present invention. The receiver 4 with the baseline wander compensation receives transmission data (that is, communication signals) from a transmitter of an Ethernet via a transmission channel 14' such as a twisted-pair wire, optical cable, coaxial cable, or other appropriate transmission interfaces. The received transmission data is then subjected to signal conversion by an Analog-to-Digital Converter (ADC) 41, and signal mapping by a slicer 45 before being read by a receiving main system 21. The receiver 4 comprises not only the ADC 41, an equalizer 44, and the slicer 45 included in the common receiver, but also an analog gain stage 40, a digital gain stage 42, an adder 43, a baseline wander compensator 46, a threshold value detector 48, a delay circuit 49, and a gain controller 47. It should be noted that the connections for the components in the receiver 4 are not limited to those shown in FIG. 3. For instance, the adder 43 may be formed as a post-stage of the equalizer 44, and the digital gain stage 42 may be formed in the equalizer 44 to allow the equalizer 44 to have a digital gain function. That is, the receiver 4 may comprises components with different connections according to a variety of embodiments.

The ADC 41 has an input end 41a and output end 41b connected to the analog gain stage 40 and digital gain stage 42 respectively. The analog gain stage 40 receives transmission data from the transmission channel 14' and the analog gain control signal 40a output from the gain controller 47 for amplitude adjustment, so that the amplitude of the received signal does not cause saturation of the ADC 41 due to baseline wander. The digital gain stage 42 receives the digital signal which converted and outputted by the ADC 41 and the delayed digital gain control signal 42a from the delay circuit 49 for amplitude adjustment and compensation. The delayed digital gain control signal 42a output from the delay circuit 49 is varied according to the gain control algorithm and a signal output from the threshold detector 48, whereas the analog gain control signal 40a output from the gain controller 47 is varied according to the gain control algorithm and signal output from the threshold value detector 48. With the analog gain control signal 40a and digital gain control signal 42a, the ADC 41 is protected from clipping of the received communication signal caused by baseline wander interference during signal conversion process.

The stage before the threshold value detector 48 of the receiver 4 with baseline wander compensation is a baseline wander compensator 46. The baseline wander compensator 46 is made up of an adder 462 and a low-pass filter 461, wherein the adder 462 obtains a differential voltage between pre-mapping and post-mapping signals from the slicer 45. The differential voltage then passes through the low-pass filer 461 to filter off high frequency signals generated by interference (e.g. noise generated from interference, such as inter-symbol or channel interferences). The threshold value detector 48 detects whether a baseline wander voltage value output from the low-pass filter exceeds a predetermined threshold value. If the detected voltage value exceeds the predetermined value, a binary word control signals are outputted, so that the binary word control signals and gain control algorithm can serve as a basis for the gain controller 47 to control the aforementioned analog gain stage and digital gain stage.

Figure 4:
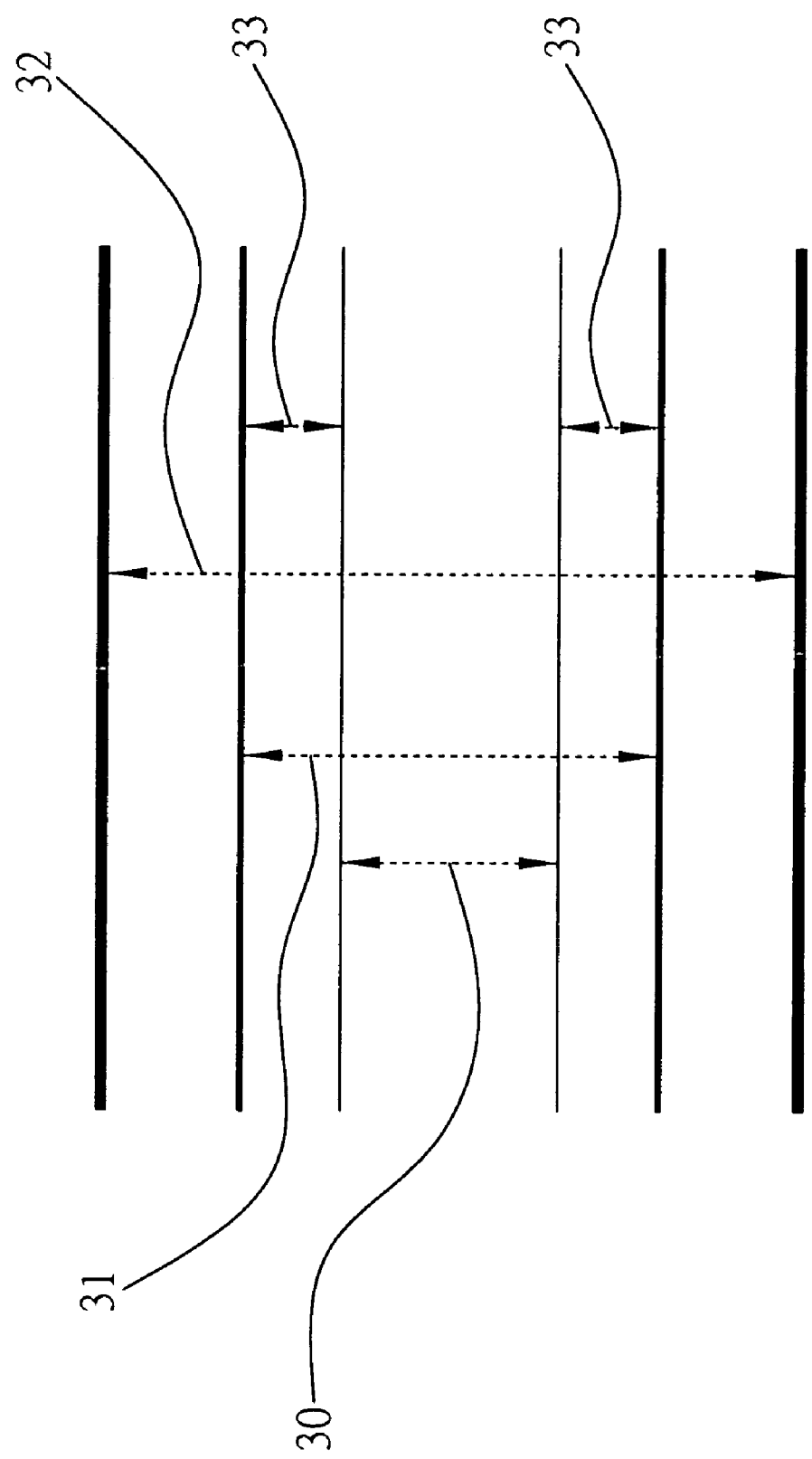
FIG. 4 is schematic diagram illustrating peak-to-peak value amplitude of analog received voltage signal in the presence and absence of baseline wander and a maximum tolerable peak-to-peak analog voltage signal of an Analog-to-Digital Converter (ADC) without clipping.

The process of detecting whether the voltage value exceeds the threshold value involves detecting whether the voltage value is higher than a predetermined upper threshold value or lower than a predetermined lower threshold value. As illustrated in FIG. 4, reference numeral 30 indicates a peak-to-peak received voltage signal sent from the transmitter without baseline wander, reference numeral 31 indicates a maximum tolerable peak-to-peak voltage signal of the ADC 41 without clipping; reference numeral 32 indicates a peak-to-peak received voltage signal from the transmitter and subjected to baseline wander interference; and reference numeral 33 indicates a headroom acceptable to the receiver 4 with baseline wander compensation for accommodate baseline wander without causing clipping of the received signal.

The peak-to-peak voltage signal which is sent from the transmitter and free of baseline wander interference, has amplitude two times larger than the amplitude when the baseline is 0. The peak-to-peak voltage signal of the ADC is twice that of the ADC reference voltage. Moreover, the peak-to-peak voltage signal which is transmitted from the transmitter and subjected to the baseline wander interference, has amplitude two times larger than the amplitude when the baseline is zero added with one of the plus or minus half cycle of the baseline wander voltage.

It is understood from FIG. 4 that the differential voltage 33 is the differential voltage of one of the half cycle yielded by subtracting the peak-to-peak voltage signal 30 sent from the transmitter (i.e. received signal sent by the transmitter main system) from the maximum tolerable peak-to-peak signal 31 without clipping. Therefore, according to the magnitude of the differential voltage 33, the threshold value detector 48 presets an upper threshold value to serve as a basis to determine if the receiver 4 is subjected to baseline wander interference which would in turns cause clipping of the received signal. Accordingly, the gain of the analog gain stage 40 is reduced and the gain of the digital gain stage 42 is increased to prevent clipping of the received signal. Moreover, according to the magnitude of the differential voltage 33, a lower threshold value is preset to serve as a basis for determining if the receiver 4 is no longer subjected to the baseline wander interference, so as to increase the gain of the analog gain stage 40 and reduce the gain of the digital gain stage 42 for effectively improving resolution of the ADC. Accordingly, the baseline wander correction is achieved with the digital baseline wander compensator. And the binary word control signal that is output by the threshold value detector 48 is input to the gain controller 47 when the baseline wander voltage is detected to be higher than the preset upper threshold value or lower than the preset lower threshold value. On the other hand, the control signals output by the gain controller 47 are respectively input to the analog gain stage 40 and the delay circuit 49, wherein the delay circuit 49 compensates for the delay in the transmission signal created during analog/digital signal conversion via the ADC 41. The compensated control signal is then output to the digital gain stage 42 to compensate for the dynamic gain variation generated by the analog gain stage 40 and adjust the amplitude of the received signal. Therefore, the ADC 41 located between the analog gain stage 40 and the digital gain stage 42 can effectively eliminate clipping of the received signal caused by baseline wander during the analog-to-digital conversion process. After the digital gain stage 42 that is located subsequent to the ADC 41 compensates the gain and amplitude of the converted signal of the ADC 41, the gain compensated signal is input to the adder 43. Thereafter, the baseline wander voltage output from the baseline wander compensator 46 and the amplitude compensated received signal output by the digital gain stage 42 are computed by the adder 43 to compensate for the baseline wander of the received signal. The compensated signal is input to the equalizer 44 to perform signal equalization. The equalized signal is then subjected to signal mapping by the slicer 45, so that the receiver main system 21 receives the signal free of baseline wander interference.

Summarizing from the above, as the threshold value detector 48 detects the baseline wander voltage value to be higher than the preset upper threshold value or lower than the preset lower threshold value, the gain controller 47 generates control signals for the analog gain stage 40 and the digital gain stage 42, respectively, to control the gains of analog and digital. That is, clipping of the received signal is prevented when the ADC 41 is affected by baseline wander interference, and resolution of the ADC 41 is improved in the absence of baseline wander interference. Hence, after the ADC 41 is avoided from clipping caused by baseline wander interference, the slicer 45 does not cause error to the data received at the receiver main system 21 when the ADC 41 is affected by baseline wander interference.

As the receiver having the baseline wander compensation of the present invention is utilized in the network transmission system, the gains of the analog gain stage and digital gain stage are automatically and dynamically adjusted based on slicing input and slicing output voltage signals of the receiver to control voltage amplitude of the received signals. Accordingly, the receiver not only prevents clipping of the received signal caused by the baseline wander as a result of electrical function of the coupler for the transmitting and receiving ends, but also improves signal-to-noise ratio of the ADC.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A receiver with baseline wander compensation applicable to a network system, the receiver comprising:

an Analog-to-Digital Converter (ADC) for receiving a compensated communication signal from the network system and performing an analog-to-digital conversion on the communication signal so as to produce a digitalized signal;

a slicer for receiving and mapping the digitalized signal;

a baseline wander compensator for receiving a pre-mapping voltage and a post-mapping voltage of the slicer, and computing and filtering the two voltages to obtain a baseline wander voltage value;

a threshold value detector for receiving the baseline wander voltage value output from the baseline wander compensator, detecting whether the voltage value exceeds a predetermined threshold value, and outputting binary word control signals if the voltage exceeds the predetermined threshold value;

a gain controller for receiving the binary word control signals from the threshold value detector, so as to provide analog and digital gain control signals based on the binary word control signals;

an analog gain stage for receiving the analog gain control signal output from the gain controller and a communication signal from the network system, so as to compensate the communication signal according to the analog gain control signal and input the compensated communication signal to the ADC;

a delay circuit for delaying the digital gain control signal output from the gain controller;

a digital gain stage for receiving the delayed digital gain control signal, so as to adjust and compensate amplitude of the digitalized signal output from the ADC; and an adder for computing the baseline wander voltage value output from the baseline wander compensator and the digitalized signal completed with the amplitude adjustment and compensation from the digital gain stage, so as to achieve baseline wander correction.

2. The receiver of claim 1, wherein the baseline wander compensator obtains a voltage difference between the pre-mapping and post-mapping voltages via another adder.

3. The receiver of claim 1, wherein the baseline wander compensator has a low pass filter for filtering a high frequency signal generated by interference.

4. The receiver of claim 3, wherein the high frequency signal is generated by inter-symbol and channel interferences.

5. The receiver of claim 1, wherein the gain controller outputs the analog and digital gain control signals according to an output of the threshold value detector and an amplitude adjustment algorithm, so as to adjust gain to prevent clipping of the received signal and enhance resolution of the ADC.

6. The receiver of claim 5, wherein the analog gain control signal is a control signal for adjusting the gain of the analog gain stage.

7. The receiver of claim 6, wherein the analog gain stage for receiving the analog gain control signal output by the gain controller is to prevent signal distortion due to clipping of amplitude of the communication signal by the ADC during baseline wander.

8. The receiver of claim 5, wherein the digital gain control signal is a control signal for adjusting the gain of the digital gain stage.

9. The receiver of claim 8, wherein the digital gain stage for receiving the delayed digital gain control signal is to compensate variations in amplitude of the communication signal and the gain of the analog gain stage.

10. The receiver of claim 9, wherein the delayed digital gain control signal accommodates the conversion delay of the ADC.

11. The receiver of claim 9, wherein the digital gain stage performs the adjustment according to magnitude of the baseline wander voltage value.

12. The receiver of claim 7, wherein the analog gain stage performs the adjustment according to magnitude of the baseline wander voltage value.

13. The receiver of claim 1, wherein the process of the threshold value detector detecting whether the voltage value exceeds a predetermined threshold value comprises detecting whether the voltage value is higher than a predetermined upper threshold value or lower than a predetermined lower threshold value for a period of time so as to output the binary word control signals accordingly.

14. The receiver of claim 13, wherein the upper or lower threshold value of the threshold value detector is obtained by a value of voltage difference of one of positive and negative half cycles yielded by subtracting a peak-to-peak received signal without baseline wander interference sent from a transmitter of the network system from a maximum tolerable peak-to-peak signal of the ADC without clipping.

15. The receiver of claim 14, wherein the peak-to-peak received voltage signal from the transmitter without baseline wander interference has amplitude twice predetermined amplitude when a baseline is zero.

16. The receiver of claim 14, wherein a voltage of the peak-to-peak voltage signal of the ADC is twice an ADC reference voltage.

17. The receiver of claim 14, wherein a peak-to-peak received voltage signal with baseline wander interference sent from the transmitter corresponds to twice the sum of predetermined amplitude when a baseline is zero and the baseline wander voltage from one of the positive and negative half cycles.

18. The receiver of claim 14, wherein the voltage difference from one of the positive and negative half cycles corresponds to a headroom of the receiver for accommodating baseline wander without clipping of the received signal.

19. The receiver of claim 1, further comprising an equalizer between the ADC and the slicer.

20. The receiver of claim 19, wherein the digital gain stage is formed in the equalizer to allow the equalizer to have a digital gaining function.

21. The receiver of claim 1, wherein the network system is an Ethernet.

* * * * *